United States Patent
Lu et al.

(10) Patent No.: US 11,963,407 B2
(45) Date of Patent: Apr. 16, 2024

(54) ORGANIC LIGHT-EMITTING DIODE DISPLAY SUBSTRATE INCLUDING AN ANODE LAYER COMPRISES A COMMON POWER LINE PROVIDED WITH VENT HOLES, DISPLAY PANEL AND DISPLAY DEVICE

(71) Applicant: BOE Technology Group Co., Ltd., Beijing (CN)

(72) Inventors: Jiangnan Lu, Beijing (CN); Guangliang Shang, Beijing (CN); Can Zheng, Beijing (CN); Yu Feng, Beijing (CN); Libin Liu, Beijing (CN); Jie Zhang, Beijing (CN); Mei Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 305 days.

(21) Appl. No.: 17/427,076

(22) PCT Filed: Nov. 13, 2020

(86) PCT No.: PCT/CN2020/128744
§ 371 (c)(1),
(2) Date: Jul. 29, 2021

(87) PCT Pub. No.: WO2021/104049
PCT Pub. Date: Jun. 3, 2021

(65) Prior Publication Data
US 2022/0149138 A1   May 12, 2022

(30) Foreign Application Priority Data
Nov. 28, 2019 (CN) .......................... 201911189833.6

(51) Int. Cl.
*H10K 59/131* (2023.01)
*G09G 3/3208* (2016.01)
*H10K 59/121* (2023.01)

(52) U.S. Cl.
CPC ......... *H10K 59/131* (2023.02); *H10K 59/121* (2023.02); *G09G 3/3208* (2013.01);
(Continued)

(58) Field of Classification Search
CPC .... H10K 59/121; H10K 59/131; H10K 58/12; H10K 58/121; H10K 58/131;
(Continued)

(56) References Cited

U.S. PATENT DOCUMENTS 9,099,038 B2   8/2015   Omoto
10,210,798 B2 *  2/2019   Kim ...................... H10K 59/12
(Continued)

FOREIGN PATENT DOCUMENTS

CN   101494014 A   7/2009
CN   107452772 A   12/2017
(Continued)

OTHER PUBLICATIONS

CN201911189833.6 first office action (dated Sep. 29, 2021).
U.S. Appl. No. 17/953,941 Non-final office Action dated Nov. 24, 2023.

Primary Examiner — Khiem D Nguyen
(74) Attorney, Agent, or Firm — IPro, PLLC

(57) ABSTRACT

Provided is an organic light-emitting diode display substrate, including: a source/drain layer, a planarization layer and an anode layer which are laminated in sequence, wherein the source/drain layer includes at least one pair of first signal lines; the anode layer includes a common power line, wherein the common power line is provided with vent holes; overlapping areas between two first signal lines in
(Continued)

each pair of the first signal lines and a projection pattern of the vent hole are equal, the overlapping area being greater than 0, wherein the projection pattern of the vent hole is a pattern of an orthographic projection of the vent hole in the common power line on the source/drain layer. A display panel and a display device are also provided.

15 Claims, 6 Drawing Sheets

(52) U.S. Cl.
CPC ............... *G09G 2320/0209* (2013.01); *G09G 2320/0233* (2013.01)

(58) Field of Classification Search
CPC ......... G09G 3/3208; G09G 2320/0209; G09G 2320/0233; G09G 2310/08; G09G 2310/0281; G09G 2300/0426; G09G 2320/0109; G02F 2001/133357
See application file for complete search history.

(56) References Cited

U.S. PATENT DOCUMENTS

| | | | |
|---|---|---|---|
| 10,312,299 B2* | 6/2019 | Jun | ........................ G06F 3/0446 |
| 10,559,260 B2 | 2/2020 | Ni et al. | |
| 2005/0040441 A1 | 2/2005 | Kimura | |
| 2005/0168491 A1* | 8/2005 | Takahara | ............... H10K 50/85 345/690 |
| 2012/0268002 A1 | 10/2012 | Osako et al. | |
| 2016/0211309 A1 | 7/2016 | Seo et al. | |
| 2017/0124945 A1 | 5/2017 | Ahn et al. | |
| 2017/0243525 A1* | 8/2017 | Morikawa | ............ H10K 59/124 |
| 2017/0345883 A1 | 11/2017 | Song et al. | |
| 2018/0032189 A1 | 2/2018 | Lee et al. | |
| 2018/0033830 A1 | 2/2018 | Kim et al. | |
| 2018/0061918 A1 | 3/2018 | Park et al. | |
| 2018/0275448 A1 | 9/2018 | Hatsumi et al. | |
| 2019/0148469 A1* | 5/2019 | Lhee | .................... H10K 50/844 257/40 |
| 2019/0394869 A1 | 12/2019 | Kim et al. | |
| 2020/0035773 A1 | 1/2020 | Cheng | |
| 2020/0373518 A1 | 11/2020 | Lee et al. | |

FOREIGN PATENT DOCUMENTS

| | | |
|---|---|---|
| CN | 107665062 A | 2/2018 |
| CN | 107665911 A | 2/2018 |
| CN | 108695365 A | 10/2018 |
| CN | 109037282 A | 12/2018 |
| CN | 209199931 U | 8/2019 |
| CN | 110890407 A | 3/2020 |

\* cited by examiner

ORGANIC LIGHT-EMITTING DIODE DISPLAY SUBSTRATE INCLUDING AN ANODE LAYER COMPRISES A COMMON POWER LINE PROVIDED WITH VENT HOLES, DISPLAY PANEL AND DISPLAY DEVICE

This application is a US national phase application based on PCT/CN2020/128744, filed on Nov. 13, 2020, which claims priority to the Chinese Patent Application No. 201911189833.6, filed on Nov. 28, 2019 and entitled "ORGANIC LIGHT-EMITTING DIODE DISPLAY SUBSTRATE, DISPLAY PANEL AND DISPLAY DEVICE", which are incorporated herein by reference in their entireties.

TECHNICAL FIELD

The present disclosure relates to an organic light-emitting diode display substrate, a display panel and a display device.

BACKGROUND

In an organic light-emitting diode display panel, an anode layer is disposed on a planarization layer (PLN). Gases are generated during preparation of the PLN. In order to exhaust these gases smoothly, vent holes are formed in a common power (VSS) line disposed in a peripheral area of the anode layer.

SUMMARY

Embodiments of the present disclosure relate to an organic light-emitting diode display substrate, a display panel and a display device.

At least one embodiment of the present disclosure provides an organic light-emitting diode display substrate. The display substrate includes:

a source/drain layer, a planarization layer and an anode layer which are laminated in sequence, wherein the source/drain layer includes at least a pair of first signal lines; the anode layer includes a common power line, the common power line is provided with vent holes;

overlapping areas between two first signal lines in any pair of the first signal lines and a projection pattern of the vent hole are equal, the overlapping area being greater than 0; and the projection pattern of the vent hole is a pattern of an orthographic projection of the vent hole in the common power line on the source/drain layer.

Optionally, the vent holes in the common power line are arranged in a plurality of columns; and two first signal lines in any pair of the first signal lines are both overlapped with the projections of at least one column of vent holes in the projection patterns of the vent holes.

Optionally, two first signal lines in one pair of the first signal lines are both overlapped with the projections of the same column of vent holes in the projection patterns of the vent holes.

Optionally, overlapping areas between the two first signal lines and the projection of the same vent hole are equal.

Optionally, a shape of each vent hole in one column of vent holes is a centrally symmetrical, and a center of the projection of the vent hole is disposed in the middle between the two first signal lines.

Optionally, a maximum size of the vent hole in a width direction of the first signal line is greater than a width of any one of the first signal lines.

Optionally, two first signal lines in one pair of the first signal lines are both overlapped with the projections of one column of vent holes in the projection patterns of the vent holes.

Optionally, two columns of vent holes whose projections are overlapped with the same pair of first signal lines are the same in quantity and area.

Optionally, the source/drain layer further includes at least one pair of second signal lines; and two second signal lines in any pair of the second signal lines are staggered from the projection patterns of the vent holes.

Optionally, the vent hole is square or circular.

Optionally, the source/drain layer includes a plurality of pairs of first signal lines; and overlapping areas between any two pairs of first signal lines and the projection patterns of the vent holes are equal or not equal.

Optionally, one pair of the first signal lines of the at least one pair of the first signal lines includes a high-level clock signal line and a low-level clock signal line.

Optionally, one pair of the first signal lines of the at least one pair of the first signal lines includes a high-level gate line and a low-level gate line.

At least one embodiment of the present disclosure provides a display panel. The display panel includes the display substrate as described above.

At least one embodiment of the present disclosure provides a display device. The display apparatus includes the display panel as described above.

DETAILED DESCRIPTION

For clearer descriptions of the objectives, technical solutions and advantages of the present disclosure, the embodiments of the present disclosure are described in detail hereinafter with reference to the accompanying drawings.

Organic light-emitting diodes (OLED) display panels may be divided into passive matrix driving OLED (PMOLED) display panels and active matrix driving OLED (AMOLED) display panels based on driving modes. The technical solutions provided in the present disclosure are mainly applied to AMOLED display panels.

Figure 1:
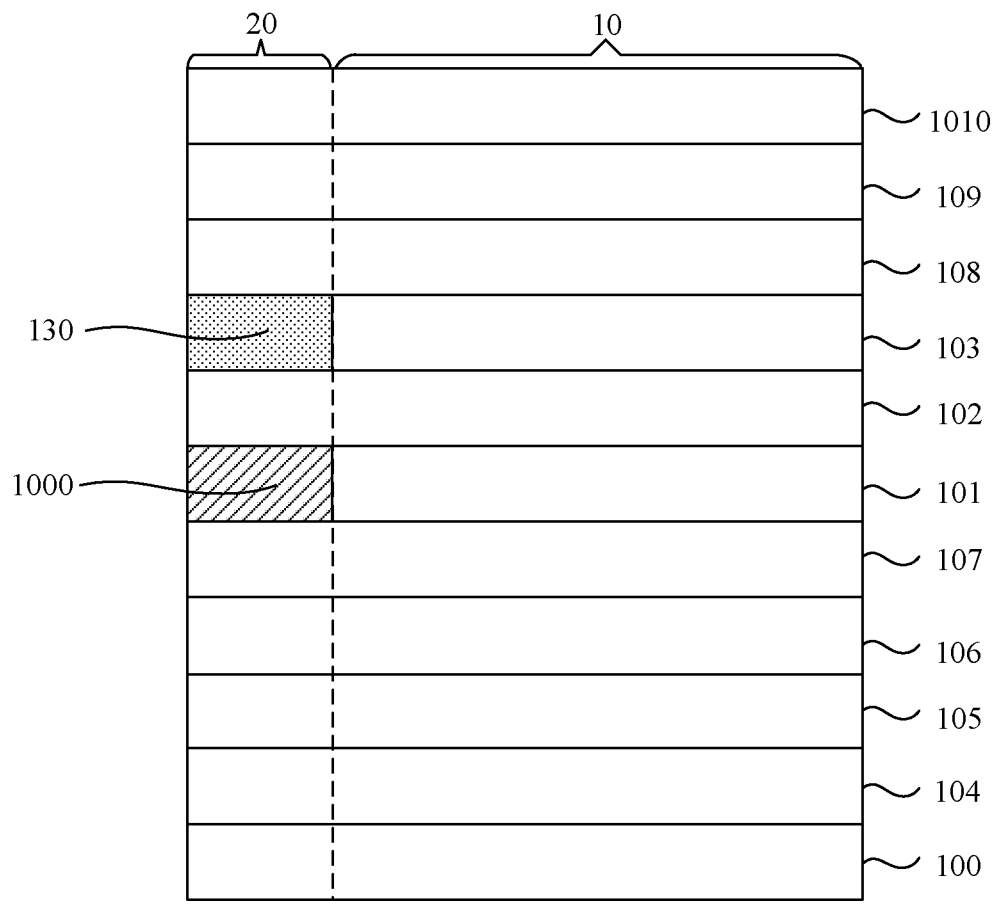
FIG. 1 is a hierarchical diagram of an OLED display substrate provided in an embodiment of the present disclosure.

FIG. 1 is a hierarchical diagram of an OLED display substrate provided in an embodiment of the present disclosure. Referring to FIG. 1, the OLED display substrate includes a substrate 100, and a first gate layer 104, a gate insulator (GI) layer 105, a second gate layer 106, an interlayer insulator layer 107, a source/drain (SD) layer 101, a planarization (PLN) layer 102, an anode layer 103, a pixel definition layer (PDL) 108, an organic light-emitting layer 109, and a cathode layer 1010 which are laminated on the substrate 100.

In an exemplary embodiment, the substrate 100 may be a transparent substrate, such as a glass substrate. The gate insulator layer 105 and the interlayer insulator layer 107 may be silicon nitride insulator layers, or other organic or inorganic insulator layers. The planarization layer 102 may be a resin layer or other organic material layers. The first gate layers 104, the second gate layer 106, and the source/drain layer 101 each may be a metal layer or an indium tin oxide thin film layer. The anode layer 103 may be a metal layer. The cathode layer 1010 may be an indium tin oxide thin film layer. The pixel definition layer 108 may be a lyophobic material layer, such as a fluorine-containing polyimide layer or a fluorine-containing polymethyl methacrylate layer. The organic light-emitting layer 109 may include a hole transport layer, a light-emitting layer, an electron transport layer, and the like, which are laminated.

Figure 2:
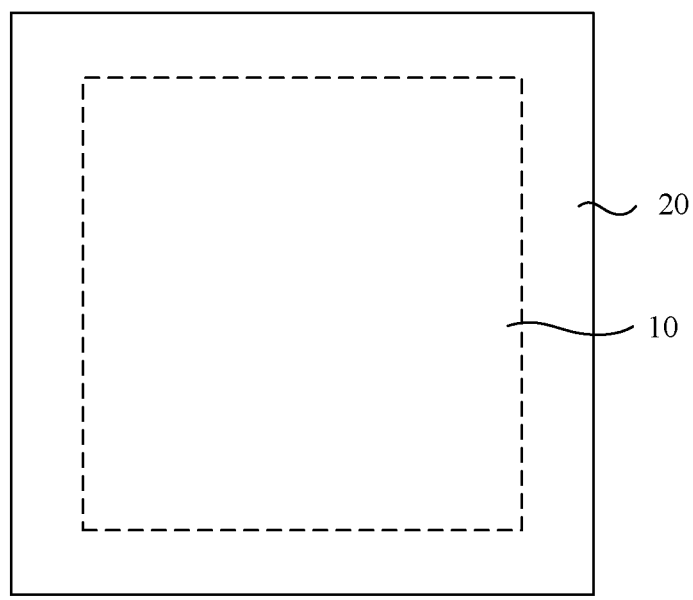
FIG. 2 is a schematic diagram of areas of an OLED display substrate provided in an embodiment of the present disclosure.

FIG. 2 is a schematic diagram of areas of an OLED display substrate provided in an embodiment of the present disclosure. Referring to FIG. 2, the OLED display panel has a display area 10 and a peripheral area 20 around the display area 10.

Referring to FIG. 1 again, in the peripheral area 20, a common power (VSS) line 130 is disposed in the anode layer 103, and signal lines 1000 configured to drive a circuit is disposed in the source/drain layer 101. For example, the signal lines 1000 disposed in the source/drain layer 101 generally include a signal line of a gate on array (GOA) circuit, clock signal lines arranged in pairs (a high-level clock signal line CK and a low-level clock signal line CB), and gate drive lines arranged in pairs (a high-level gate line VGH and a low-level gate line VGL).

Figure 3:
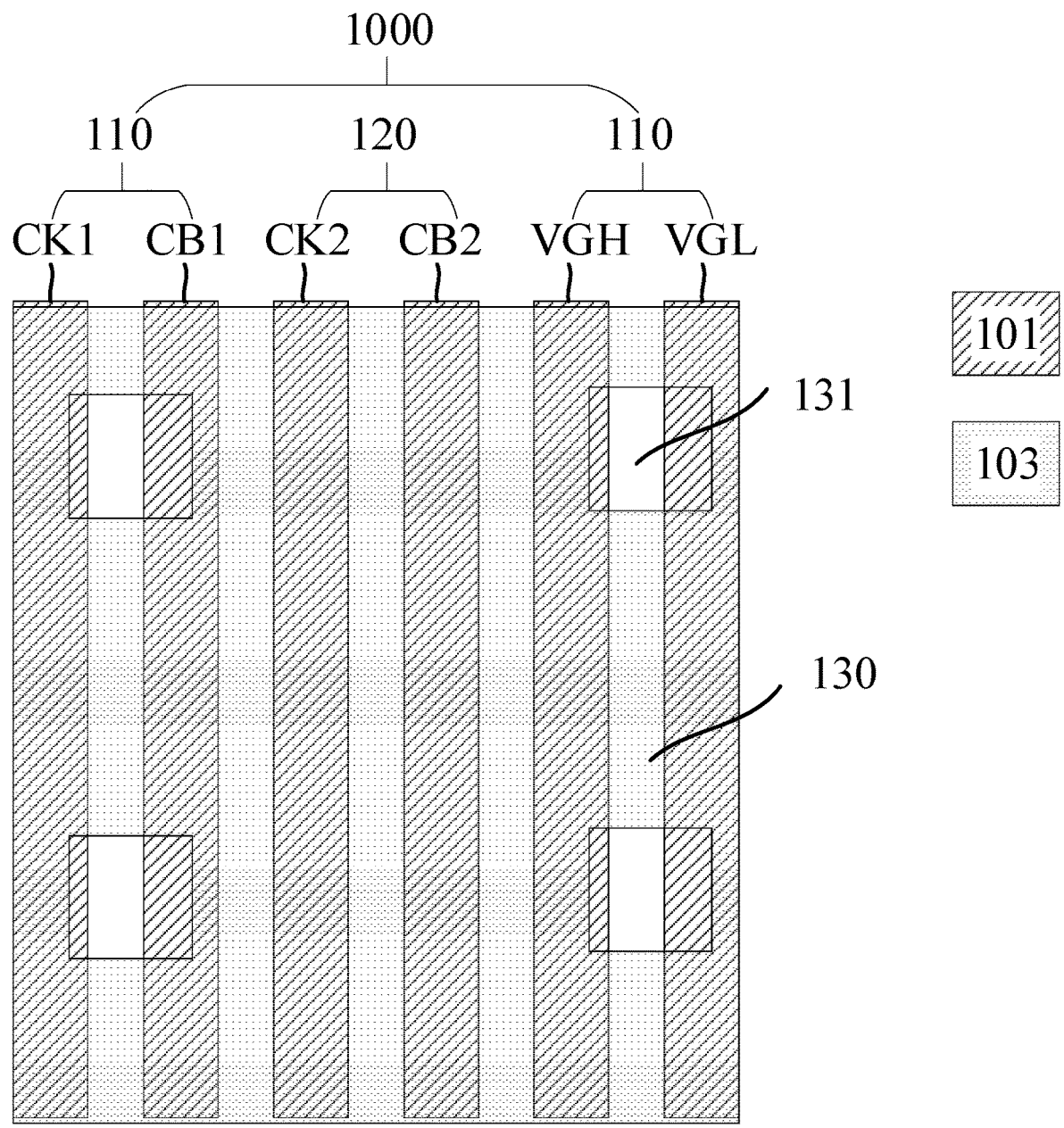
FIG. 3 is a schematic diagram of film layers in the related art.

Large parasitic capacitances exist in the VSS line of the anode layer and wiring of the source/drain layer. FIG. 3 is a schematic diagram of film layers in the related art. Referring to FIG. 3, the signal lines 1000 include first signal lines 110 and second signal lines 120. The first signal line 110 is a signal line which is overlapped with a projection of the vent hole 131, and the second signal line 120 is a signal line that is staggered (not overlapped) with the projection of the vent hole 131.

Overlapping areas between the vent hole 131 in the VSS line and two first signal lines in one pair of first signal lines 110 are not equal. For example, the overlapping area between the vent hole 131 and CK1 and the overlapping area between the vent hole 131 and CB1 are not equal. In this case, the overlapping areas between the VSS line 130 and two first signal lines 110 of one pair of first signal lines 110 are not equal, which causes different parasitic capacitances generated between the VSS line 130 and the two first signal lines 110. Different parasitic capacitances lead to mismatch between signals transmitted by one pair of first signal lines (that is, the durations of rising edges and the durations of falling edges of the signals transmitted by two first signal lines in one pair of first signal lines are not equal respectively), resulting in non-uniformity of a display image. It should be noted that FIG. 3 only shows the wiring layout in the peripheral area on one side of the display area, for example, the peripheral area on the left side of the display area. The peripheral area on the right side of the display area has the same structure as the peripheral area on the left side of the display area. While, the VSS line passes through the peripheral areas on the left, upper, and right sides of the display area, and thus the first signal lines 110 on the left and right sides of the display area are both affected by uneven parasitic capacitances.

The following table shows the magnitude of the parasitic capacitances between the VSS line and the CK1 as well as between the VSS line and the CB1 in FIG. 3.

| Parasitic capacitance between CK1 and VSS line | 63.034 fF |
| Parasitic capacitance between CB1 and VSS line | 52.562 fF |

It can be seen from the table that the difference between the parasitic capacitance between the CK1 and the VSS line and the parasitic capacitance between the CB1 and the VSS line is at least 10 fF.

Figure 4:
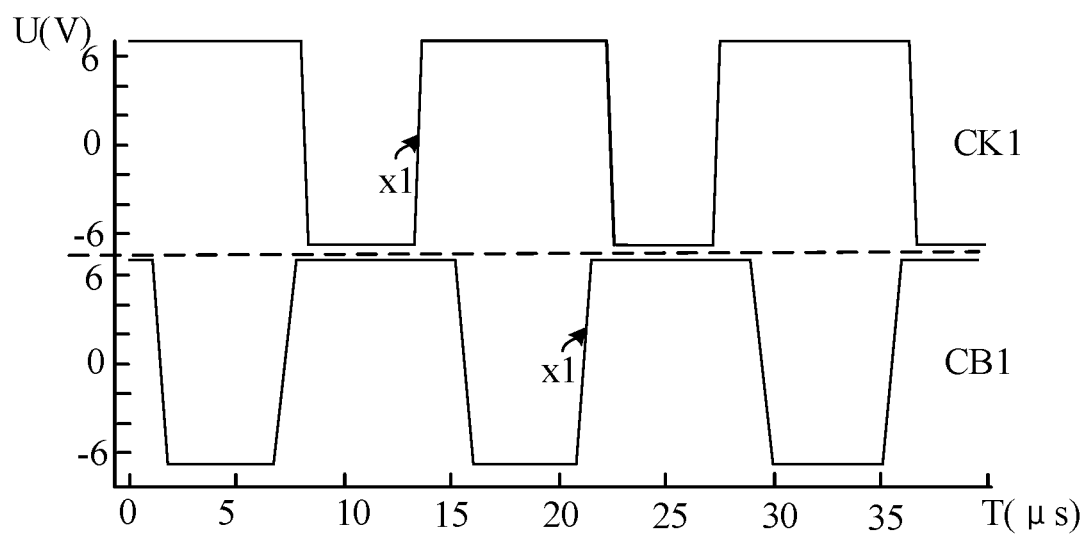
FIG. 4 is a timing diagram of a clock signal in the related art.

FIG. 4 is a timing diagram of a clock signal in the related art. Referring to FIG. 4, since the difference between the parasitic capacitance between the CK1 and the VSS line and the parasitic capacitance between the CB1 and the VSS line is 10 fF, the duration of the rising edge x1 (or a falling edge) of the CK1 is inconsistent with the duration of the rising edge x1 (or a falling edge) of the CB1 (as shown in FIG. 4, the rising edge of the CK1 and the rising edge of the CB1 have different slopes, and similarly, the falling edge of the CK1 and the falling edge of the CB1 also have different slopes). Since the durations of the rising edges (or the falling edges) of the two signals are different, high-level durations and low-level durations of the two signals are different either, resulting in the output mismatch and abnormal display of the display panel. The higher the frequency of the display panel is, the greater the impact of this rising duration and falling duration is. Therefore, the display abnormality is more serious in a high-frequency state.

Figure 5:
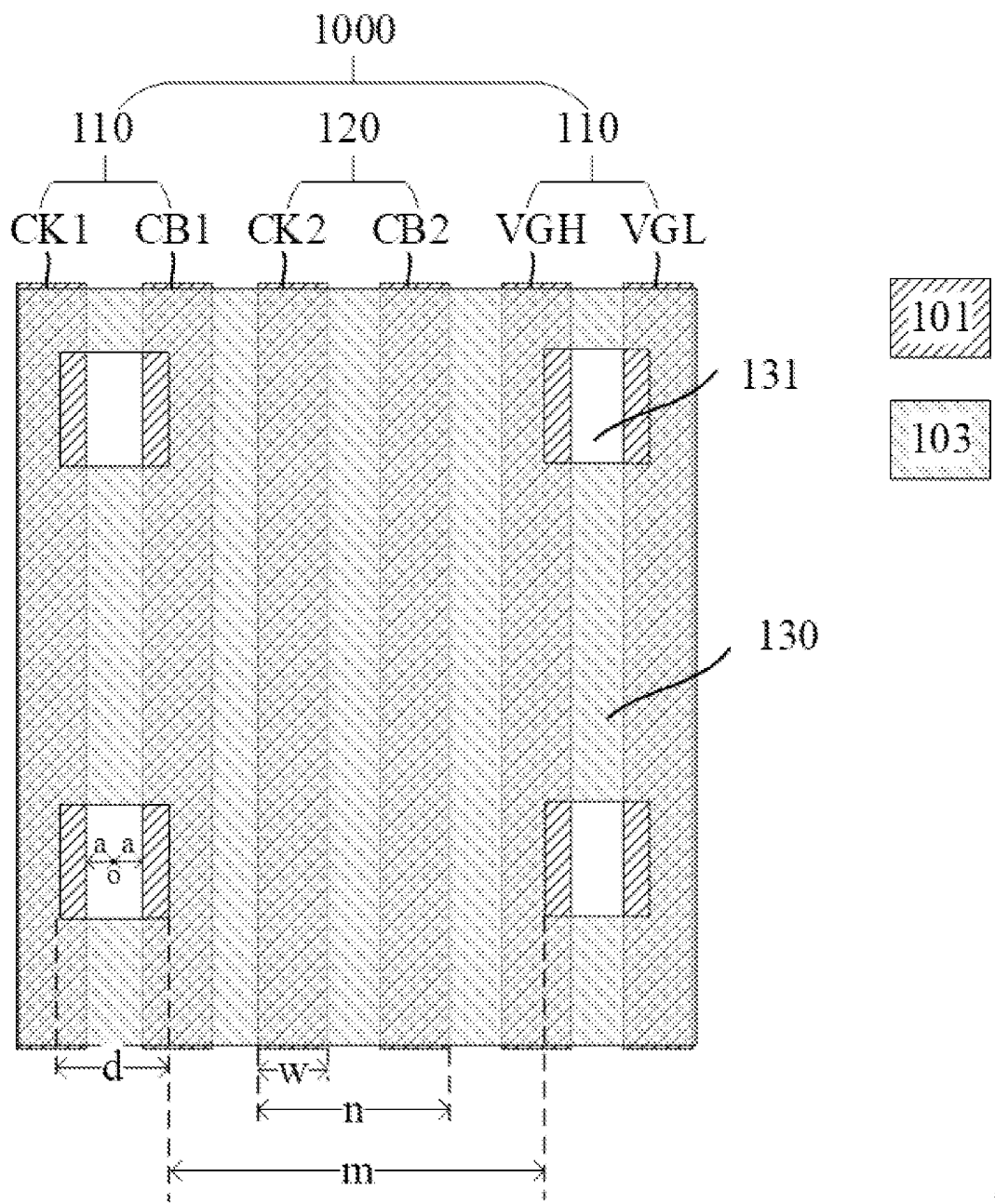
FIG. 5 is a schematic structural diagram of an organic light-emitting diode display substrate provided in an embodiment of the present disclosure.

FIG. 5 is a schematic structural diagram of an organic light-emitting diode display substrate provided in an embodiment of the present disclosure. Referring to FIG. 5, the source/drain layer 101 includes at least a pair of first signal lines 110; and an anode layer 103 includes a common power line 130 which is provided with vent holes 131.

Overlapping areas between two first signal lines 110 in any pair of the first signal lines 110 and a projection pattern of the vent hole are equal, and the overlapping area is greater than 0. The projection pattern of the vent hole is a pattern of an orthographic projection of the vent hole 131 in the common power line 130 on the source/drain layer 101. "Overlapping" means that overlapping area between the first signal line 110 and the projection pattern of the vent hole is greater than 0.

In the embodiment of the present disclosure, by setting the overlapping areas between the common power line and the two first signal lines in one pair of first signal lines to be equal, parasitic capacitances between the common power line and the two first signal lines in the pair of first signal lines are equal, such that the signals transmitted by the pair of first signal lines match with each other. That is, the durations of the rising edges and the durations of the falling edges of the signals transmitted by the two first signal lines in the pair of first signal lines are equal, respectively, which ensures the uniformity of the display image.

The effects of the solutions provided by the present disclosure are described by taking a pair of first signal lines CK1 and CB1 as an example. The following table shows the magnitude of the parasitic capacitance between the VSS line and the CK1 as well as the magnitude of the parasitic capacitance of between the VSS line and the CB1 in FIG. 5.

| | |
|---|---|
| Parasitic capacitance between CK1 and VSS line | 63.233 fF |
| Parasitic capacitance between CB1 and VSS line | 64.281 fF |

It can be seen from the table that the difference between the parasitic capacitance between the CK1 and the VSS line and the parasitic capacitance between the CB1 and the VSS line is only about 1 fF, which is much smaller than the difference between parasitic capacitances in the related art (in the related art, the difference between the parasitic capacitance between CK1 and the VSS line and the parasitic capacitance between CB1 and the VSS line is at least 10 fF).

Figure 6:
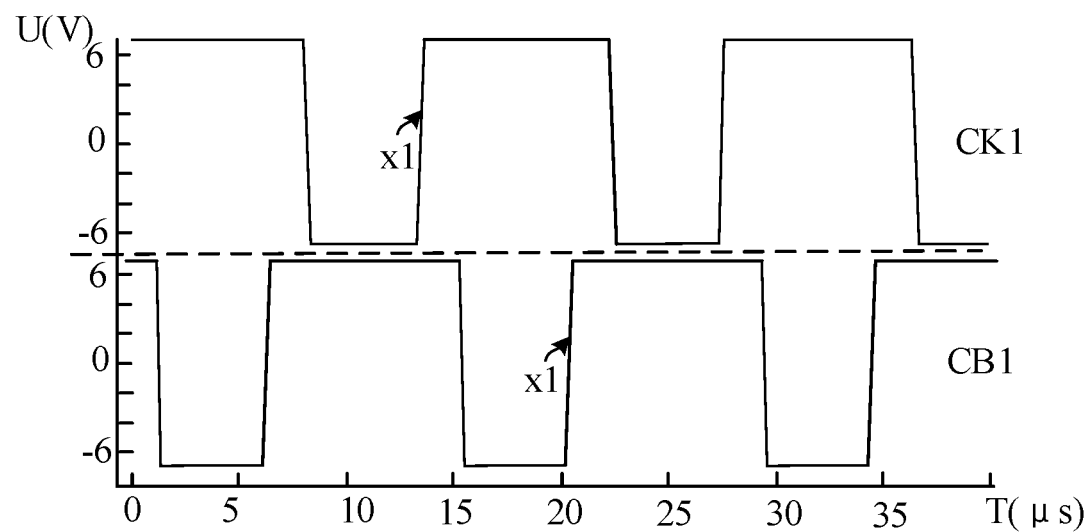
FIG. 6 is a timing diagram of a clock signal provided in an embodiment of the present disclosure.

FIG. 6 is a timing diagram of a clock signal provided in an embodiment of the present disclosure. Referring to FIG. 6, since the difference between the parasitic capacitance between the CK1 and the VSS line and the parasitic capacitance between the CB1 and the VSS line is relatively small, the duration of the rising edge x1 (or the falling edge) of the CK1 is the same as the duration of the rising edge x1 (or the falling edge) of the CB1 (as shown in FIG. 6, the rising edge of the CK1 and the rising edge of the CB1 have the same slope, and similarly, the falling edge of the CK1 and the falling edge of the CB1 also have the same slope). Since the durations of the rising edges (or the falling edges) of the two signals are the same, the high-level durations and low-level durations of the two signals are also the same, respectively, thereby achieving the output match and ensuring the display uniformity of the display panel. Even if in a high-frequency display product, such rising duration and falling duration do not affect the display uniformity, and thus the display effect is ensured.

As shown in FIG. 5, the vent holes 131 in the common power line 130 are arranged in a plurality of columns. In other implementations, the vent holes 131 in the common power line 130 may not be distributed in columns. For example, the vent holes 131 are distributed irregularly, as long as it is ensured that overlapping areas between two first signal lines in each pair of first signal lines and the projection pattern of the vent hole are equal.

In the structure shown in FIG. 5, two first signal lines 110 in any pair of first signal lines 110 are both overlapped with the projections of at least one column of vent holes 131 in the projection patterns of the vent holes. That is, in the embodiments of the present disclosure, one pair of first signal lines 110 may be only overlapped with the projections of one column of vent holes 131, or overlapped with the projections of a plurality of columns of vent holes 131.

In the embodiments of the present disclosure, the overlapping areas between two first signal lines 110 in one pair of first signal lines 110 and the projection pattern of the vent hole may be made equal in a plurality of implementations. As it is only necessary to ensure that the overlapping areas between two first signal lines 110 in each pair of first signal lines and the projection pattern of the vent hole are equal, different pairs of first signal lines may be overlapped with the projection pattern of the vent hole in the same implementation or different implementations. Several possible overlapping implementations are introduced below.

In a possible implementation, two first signal lines 110 in one pair of the at least pair of first signal lines 110 are both overlapped with the projections of the same column of vent holes 131 in the projection patterns of the vent holes 131.

In an exemplary embodiment, as shown in FIG. 5, the overlapping areas between the two first signal lines 110 and the same vent hole 131 are equal. In other implementations, the overlapping areas between the two first signal lines 110 and the projection of the same vent hole 131 may be not equal, as long as the sum of the overlapping areas between one first signal line and the projections of a plurality of vent holes 131 is equal to the sum of the overlapping areas between the other first signal line and the projections of the vent holes 131. For example, the overlap between the leftmost pair of first signal lines and the projection patterns of the vent holes in FIG. 5 may also be designed as follows: the overlapping area between the projection of a first hole and the first signal line on the left side of the pair of first signal lines is larger than the overlapping area between the projection of the first hole and the first signal line on the right side of the pair of first signal lines; the overlapping area between the projection of a second hole and the first signal line on the left side of the pair of first signal lines is less than the overlapping area between the projection of the second hole and the first signal line on the right side of the pair of first signal lines, but the sum of the overlapping areas between the projections of the two holes and the first signal line on the left side of the pair of first signal lines is equal to the sum of the projections between the two holes and the first signal line on the right side of the pair of first signal lines.

In the implementation shown in FIG. 5, the two first signal lines 110 in one pair of first signal lines 110 are both overlapped with the projections of the same column of vent holes 131 in the projection patterns of the vent holes 131. As long as the overlapping areas between the projection of each vent hole 131 and the two first signal lines 110 are equal, it can be ensured that the overlapping areas between the two first signal lines 110 in one pair of first signal lines 110 and the projection patterns of the vent holes are equal. Since there is a certain distance between the two first signal lines, if one vent hole 131 is overlapped with two first signal lines, the vent hole 131 may be designed to be large, to facilitate the patterning of the common power line.

As shown in FIG. 5, CK1 and CB1 are overlapped with the projections of the same column of vent holes 131, and the overlapping areas between CK1 and CB1 and the projection of the same vent hole 131 are equal. VGH and VGL are overlapped with the projections of the same column of vent holes 131, and the overlapping areas between VGH and VGL and the projection of the same vent hole 131 are equal.

In the structure shown in FIG. 5, the shape and area of the vent hole 131 which is overlapped with CK1 and CB1 are the same as the shape and area of the vent hole 131 which is overlapped with VGH and VGL. In other implementations, the shape of the vent hole 131 which is overlapped with CK1 and CB1 may also be different from the shape of the vent hole 131 which is overlapped with VGH and VGL; or the area of the vent hole 131 which is overlapped with CK1 and CB1 may also be different from the area of the vent hole 131 which is overlapped with VGH and VGL.

In an exemplary embodiment, the shape of each vent hole 131 in one column of vent holes 131 is centrally symmetrical, and the center of the projection of the vent hole 131 is in the middle between two first signal lines 110 of one pair of first signal lines 110.

As shown in FIG. 5, the center O of the projection of the vent hole 131 is in the middle between the two first signal lines 110. That is, the distances from the center O to the side edges of the two first signal lines 110 are equal.

As shown in FIG. 5, the vent hole 131 may be square. In other implementations, the vent hole 131 may also be circular. Square or circular vent holes 131 are convenient to design and manufacture. In other implementations, the vent hole 131 may be in other regular or irregular shapes.

In this implementation, the maximum size of the vent hole 131 in the width direction of the first signal line 110 may be greater than the width of any of the first signal lines 110. For example, as shown in FIG. 5, the side length d of the vent hole 131 is greater than the width w of the first signal line 110.

In an exemplary embodiment, in FIG. 5, respective vent holes 131 in one column of vent holes 131 are the same in shape and area. In other implementations, the shapes of respective vent holes 131 in one column of vent holes 131 may not be exactly the same. For example, some vent holes 131 are circular, and some vent holes 131 are square. Alternatively, the areas of respective vent holes 131 in one column of vent holes 131 may not be exactly the same. For example, the areas of some vent holes 131 are equal, but the areas of the other vent holes 131 are different from each other.

In a possible implementation, two first signal lines 110 in one pair of at least one pair of first signal lines 110 are both overlapped with the projections of one column of vent holes 131 in the projection patterns of the vent holes 131.

In an exemplary embodiment, the vent holes 131 in two columns of vent holes 131 are the same in quantity and area.

In this way, two first signal lines 110 in one pair of first signal lines 110 are overlapped with the projection patterns of two columns of vents holes 131, respectively. As long as the vent holes in the two columns of vent holes 131 are equal in quantity and area, it can be ensured that the overlapping areas between the two first signal lines 110 in one pair of first signal lines 110 and the projection patterns of the vent holes are equal, thereby facilitating the design and manufacture of the vent holes.

In an exemplary embodiment, the respective vent holes 131 are the same in shape. The vent holes in the same shape is convenient to design and manufacture, and it is easier to ensure that the areas of the respective vent holes 131 are equal, thereby ensuring that the overlapping areas between the two first signal lines 110 and the projections of two columns of vent holes 131 are equal.

In other implementations, the quantities of the vent holes 131 in two columns of vent holes 131 may be not equal, or the areas of at least part of the vent holes 131 are not equal, as long as the sum of the areas of one column of vent holes 131 which are overlapped with one first signal line is equal to the sum of the areas of one column of vent holes 131 which are overlapped with the other first signal line.

Figure 7:
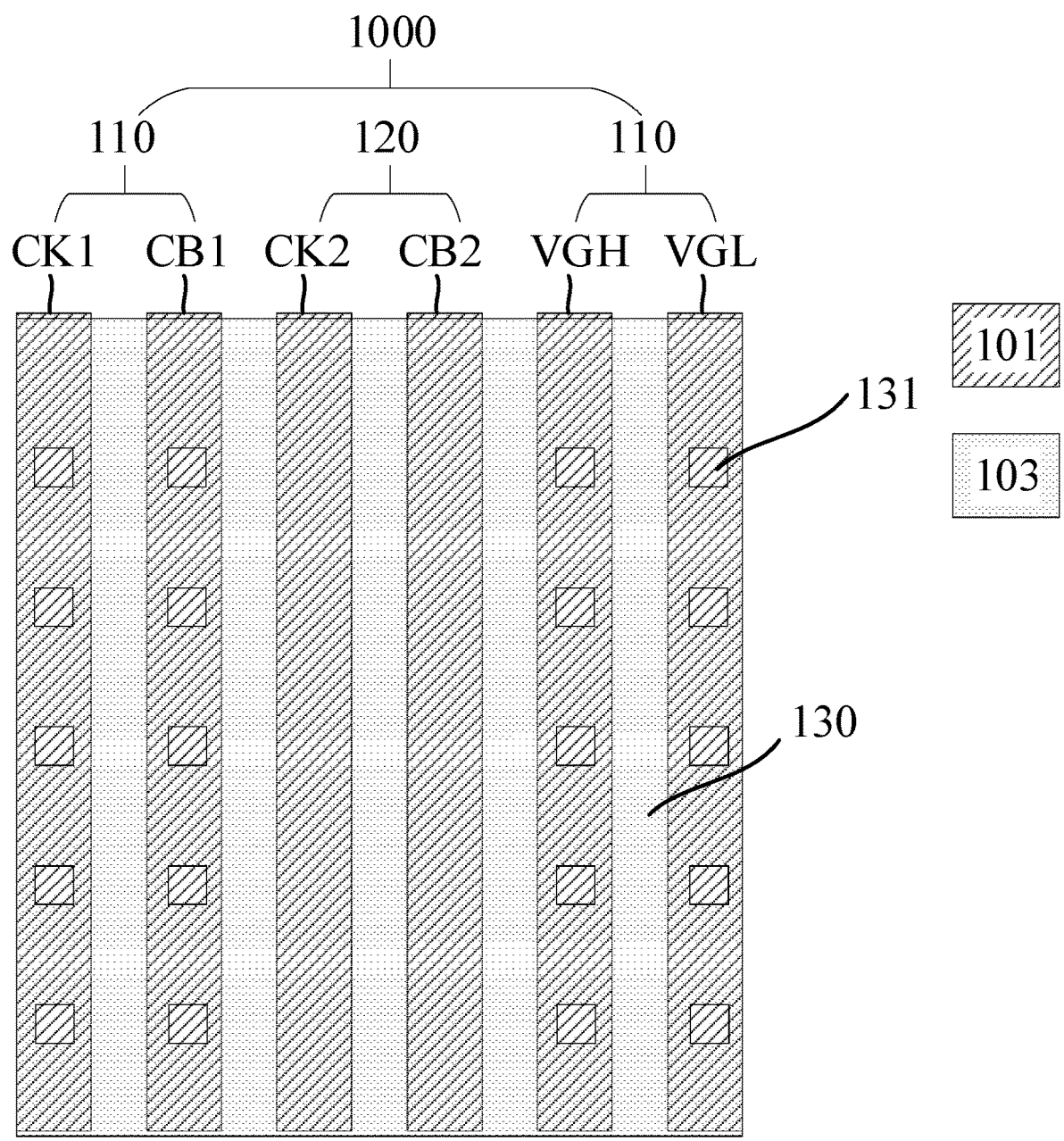
FIG. 7 is a schematic structural diagram of another organic light-emitting diode display substrate provided in an embodiment of the present disclosure.

FIG. 7 is a schematic structural diagram of another organic light-emitting diode display substrate provided in an embodiment of the present disclosure. Referring to FIG. 7, the vent hole 131 may be square. In other implementations, the vent hole 131 may also be circular. Square or circular vent holes 131 are convenient to design and manufacture. In other implementations, the vent hole 131 may be in other regular or irregular shapes.

As the distance between two first signal lines is not long, in order to prevent two columns of vent holes 131 from being too close to affect patterning, the size of the vent hole 131 may be appropriately reduced, so as to increase the distance between two columns of vent holes 131.

For example, the maximum size of the vent hole 131 in the width direction of the first signal line 110 may be less than the width of any one of the first signal lines 110. As shown in FIG. 7, the side length or diameter of the vent hole 131 may be less than the width of the first signal line 110.

In addition to the implementation in which one first signal line 110 is overlapped with one column of vent holes in FIG. 7, one first signal line 110 may also be overlapped with a plurality of columns of vent holes.

As the first signal lines 110 are arranged in the column direction of the display substrate, in order to facilitate design and manufacture, the vent holes 131 in the present disclosure are also arranged in the column direction. In other implementations, the vent holes may also be arranged in other directions, for example, the arrangement direction and the column direction may form an angle, which is not limited in the present disclosure.

Referring to FIG. 5 and FIG. 7 again, the source/drain layer 101 further includes at least one pair of second signal lines 120. Two second signal lines 120 in any pair of second signal lines 120 are staggered (not overlapped with) from the projection patterns of the vent holes. Since the two second signal lines 120 both are not overlapped with the projection patterns of the vent holes, it's also ensured that the parasitic capacitances between the two second signal lines 120 and the common power line are equal in this implementation.

As the vent holes 131 may be distributed at intervals, as shown in FIG. 5, one pair of second signal lines 120 may be not overlapped with the projection patterns of the vent holes when the spacing m between the vent holes 131 in the line direction is greater than the total width n of one pair of second signal lines.

As shown in FIG. 5 and FIG. 7, neither the second signal line CK2 nor the second signal line CB2 is overlapped with the protections of the vent holes 131. That is, the projections of the vent holes 131 on the source/drain layer are all outside of CK2 and CB2.

Referring to FIG. 5 and FIG. 7 again, the source/drain layer 101 includes a plurality of pairs of first signal lines 1000. The overlapping areas between any two pairs of signal lines 1000 and the projection patterns of the vent holes may be equal or unequal.

That is, in the embodiments of the present disclosure, different pairs of signal lines 1000 may be implemented in different ways. The parasitic capacitances between one pair of signal lines and the common power line may be balanced, without the need to adopt this implementation for each pair of signal lines, which provides a higher degree of freedom for design.

For example, in FIG. 5, the leftmost pair of first signal lines 110 and the rightmost pair of first signal lines 110 are configured to be both overlapped with the projections of the same column of vent holes 131, respectively, and the overlapping areas between the two pairs of signal lines 1000 and the projection patterns of the vent holes are equal.

The leftmost pair of first signal lines 110 are configured to be overlapped with the projections of the same column of vent holes 131, and the middle pair of second signal lines 120 are configured to be not overlapped with the projections of the vent holes 131 (i.e., the overlapping area is 0), and the overlapping areas between the two pairs of the signal lines 1000 and the projection patterns of the vent holes are not equal.

In FIG. 7, the leftmost pair of first signal lines 110 and the rightmost pair of first signal lines 110 are configured to be overlapped with the projections of one column of vent holes 131, and the overlapping areas between the two pairs of signal lines 1000 and the projection patterns of the vent holes are equal.

The leftmost pair of first signal lines 110 are configured to be overlapped with the projections of one column of vent holes 131, and the middle pair of second signal lines 120 are configured to be not overlapped with the projections of the vent holes 131, and the overlapping areas between the two pairs of signal lines 1000 and the projection patterns of the vent holes are not equal.

In other implementations, each pair of signal lines 1000 may also be configured to be overlapped with the projections of the vent holes 131 in the same way or in three ways, which is not limited in the present disclosure.

The present disclosure provides a display panel. The display panel includes the display substrate shown in FIG. 5 or FIG. 7.

In the embodiments of the present disclosure, by setting the overlapping areas between the common power line and the two first signal lines in one pair of first signal lines to be equal, the parasitic capacitances between the common power line and the two first signal lines in the pair of first signal lines are equal, such that the signals transmitted by the pair of first signal lines match with each other. That is, the durations of the rising edges and the durations of the falling edges of the signals transmitted by the two first signal lines in the pair of first signal lines are equal, respectively, which ensures the uniformity of the display image.

The present disclosure provides a display device. The display device includes the display panel described above.

During specific implementation, the display device provided in the embodiment of the present disclosure may be any product or component with a display function, such as a mobile phone, a tablet computer, a television, a display, a laptop computer, a digital photo frame or a navigator.

In the embodiment of the present disclosure, by setting the overlapping areas between the common power line and the two first signal lines in one pair of first signal lines to be equal, the parasitic capacitances between the common power line and the two first signal lines in the pair of first signal lines are equal, such that the signals transmitted by the pair of first signal lines match with each other. That is, the durations of the rising edges and the durations of the falling edges of the signals transmitted by the two first signal lines in the pair of first signal lines are equal, respectively, which ensures the uniformity of the display image.

Described above are merely optional embodiments of the present disclosure, and are not intended to limit the present disclosure. Within the spirit and principles of the present disclosure, any modifications, equivalent substitutions, improvements, and the like are within the protection scope of the present disclosure.

What is claimed is:

1. An organic light-emitting diode display substrate, comprising:
a source/drain layer, a planarization layer and an anode layer which are laminated in sequence, wherein
the source/drain layer comprises at least one pair of first signal lines; the anode layer comprises a common power line, wherein the common power line is provided with vent holes;
overlapping areas between two first signal lines in each pair of the first signal lines and a projection pattern of the vent hole are equal, the overlapping area being greater than 0, wherein the projection pattern of the vent hole is a pattern of an orthographic projection of the vent hole in the common power line on the source/drain layer.

2. The display substrate according to claim 1, wherein the vent holes in the common power line are arranged in a plurality of columns; and
two first signal lines in any pair of the first signal lines are overlapped with projections of at least one column of vent holes in the projection patterns of the vent holes.

3. The display substrate according to claim 2, wherein two first signal lines in one pair of the first signal lines are both overlapped with the projections of a same column of vent holes in the projection patterns of the vent holes.

4. The display substrate according to claim 3, wherein the overlapping areas between the two first signal lines and a same vent hole are equal.

5. The display substrate according to claim 4, wherein a shape of each vent hole in the one column of vent holes is centrally symmetrical, and a center of the projection of the vent hole is in the middle between the two first signal lines.

6. The display substrate according to claim 3, wherein a maximum size of the vent hole in a width direction of the first signal line is greater than a width of any one of the first signal line.

7. The display substrate according to claim 2, wherein two first signal lines in one pair of the first signal lines are both overlapped with projections of one column of vent holes in the projection patterns of the vent holes.

8. The display substrate according to claim 7, wherein two columns of vent holes whose projections are overlapped with a same pair of first signal lines are the same in quantity and area.

9. The display substrate according to claim 1, wherein the source/drain layer further comprises at least one pair of second signal lines; and two second signal lines in any pair of the second signal lines are staggered from the projection patterns of the vent holes.

10. The display substrate according to claim 1, wherein the vent hole is square or circular.

11. The display substrate according to claim 1, wherein the source/drain layer comprises a plurality of pairs of first signal lines; and overlapping areas between any two pairs of first signal lines and the projection patterns of the vent holes are equal or unequal.

12. The display substrate according to claim 1, wherein one pair of the at least one pair of the first signal lines comprises a high-level clock signal line and a low-level clock signal line.

13. The display substrate according to claim 1, wherein one pair of the at least one pair of the first signal lines comprises a high-level gate line and a low-level gate line.

14. A display panel, comprising the organic light-emitting diode display substrate according to claim 1.

15. A display device, comprising the display panel according to claim 14.

* * * * *